(12) United States Patent
Jeong

(10) Patent No.: US 9,627,609 B2
(45) Date of Patent: Apr. 18, 2017

(54) METHOD OF MANUFACTURING A MAGNETIC MEMORY DEVICE

(71) Applicant: Dae Eun Jeong, Yongin-si (KR)

(72) Inventor: Dae Eun Jeong, Yongin-si (KR)

(73) Assignee: SAMSUNG ELECTRONICS CO., LTD (KR)

( * ) Notice: Subject to any disclaimer, the term of this patent is extended or adjusted under 35 U.S.C. 154(b) by 0 days.

(21) Appl. No.: 14/821,763

(22) Filed: Aug. 9, 2015

(65) Prior Publication Data

US 2016/0163971 A1    Jun. 9, 2016

(30) Foreign Application Priority Data

Dec. 8, 2014 (KR) .................... 10-2014-0175196

(51) Int. Cl.

| H01L 43/12 | (2006.01) |
|---|---|
| H01L 43/02 | (2006.01) |
| H01L 43/08 | (2006.01) |
| H01L 43/10 | (2006.01) |
| H01L 27/22 | (2006.01) |

(52) U.S. Cl.
CPC ............ *H01L 43/12* (2013.01); *H01L 27/228* (2013.01); *H01L 43/02* (2013.01); *H01L 43/08* (2013.01); *H01L 43/10* (2013.01)

(58) Field of Classification Search
CPC ..................................................... H01L 43/12
See application file for complete search history.

(56) References Cited

U.S. PATENT DOCUMENTS

| 8,790,798 B2 | 7/2014 | Shukh |
| 2002/0098627 A1 | 7/2002 | Pomarede et al. |
| 2005/0048674 A1* | 3/2005 | Shi .................... B82Y 10/00 438/3 |
| 2006/0023492 A1 | 2/2006 | Min et al. |
| 2007/0080381 A1 | 4/2007 | Chien et al. |

(Continued)

FOREIGN PATENT DOCUMENTS

| JP | 2010074171 A | 4/2010 |
| JP | 2012064623 A | 3/2012 |

(Continued)

OTHER PUBLICATIONS

Wang et al, Tunnel Junction with Perpendicular Magnetic Anisotropy: Status and Challenges, Aug. 10, 2015, Micromachines, 6, pp. 1023-1045.*

*Primary Examiner* — Fernando L Toledo
*Assistant Examiner* — Valerie N Newton
(74) *Attorney, Agent, or Firm* — Renaissance IP Law Group LLP

(57) ABSTRACT

A method of manufacturing a magnetic memory device may include forming a lower magnetic layer, a tunnel barrier layer, and an upper magnetic layer on a substrate, forming a magnetic tunnel junction pattern by etching a stacked structure including the lower magnetic layer, the tunnel barrier layer, and the upper magnetic layer, forming a boron-absorption layer covering the magnetic tunnel junction pattern, and performing a heat treatment process so that boron included in the upper and lower magnetic layers may be absorbed by the boron-absorption layer. The heat treatment process may be undertaken in a gaseous atmosphere including at least one of hydrogen, oxygen, and nitrogen.

5 Claims, 14 Drawing Sheets

(56) References Cited

U.S. PATENT DOCUMENTS

| | | | |
|---|---|---|---|
| 2008/0253039 A1* | 10/2008 | Nagamine | B82Y 10/00 360/324.2 |
| 2009/0080239 A1 | 3/2009 | Nagase et al. | |
| 2009/0302404 A1* | 12/2009 | Matsuda | H01L 43/12 257/421 |
| 2010/0027328 A1 | 2/2010 | Czubatyj et al. | |
| 2010/0072566 A1 | 3/2010 | Kang et al. | |
| 2010/0073828 A1 | 3/2010 | Wang et al. | |
| 2011/0227179 A1* | 9/2011 | Kitagawa | H01L 27/228 257/421 |
| 2012/0063222 A1 | 3/2012 | Yamane et al. | |
| 2013/0288398 A1 | 10/2013 | Yamamoto et al. | |
| 2014/0001586 A1 | 1/2014 | Shen et al. | |
| 2014/0061827 A1 | 3/2014 | Huang et al. | |
| 2014/0084398 A1* | 3/2014 | Oguz | H01L 43/12 257/421 |
| 2014/0175580 A1* | 6/2014 | Chen | H01L 43/08 257/421 |
| 2014/0175581 A1 | 6/2014 | Guo | |
| 2014/0210103 A1 | 7/2014 | Satoh et al. | |
| 2014/0252515 A1* | 9/2014 | Lai | H01L 43/12 257/421 |
| 2014/0284592 A1 | 9/2014 | Nagamine et al. | |
| 2014/0299950 A1* | 10/2014 | Kim | H01L 27/228 257/421 |

FOREIGN PATENT DOCUMENTS

| | | |
|---|---|---|
| JP | 2013145846 A | 7/2013 |
| JP | 2014135449 A | 7/2014 |
| KR | 20030051873 A | 6/2003 |
| KR | 100875383 B1 | 12/2008 |
| KR | 101052419 B1 | 7/2011 |
| KR | 20130115261 A | 10/2013 |
| KR | 1020130108418 A | 10/2013 |
| WO | 2012040317 A2 | 3/2012 |

* cited by examiner

METHOD OF MANUFACTURING A MAGNETIC MEMORY DEVICE

CROSS-REFERENCE TO RELATED APPLICATION

This application claims the priority and benefit of Korean Patent Application No. 10-2014-0175196, filed Dec. 8, 2014 with the Korean Intellectual Property Office, the entirety of which is incorporated herein by reference.

BACKGROUND

The present inventive concepts relate to a method of manufacturing a magnetic memory device and magnetic memory devices resulting therefrom.

Due to the trend toward higher speed and lower power consumption in electronic products, semiconductor devices embedded therein need to be able to perform high speed read/write operations and have low operational voltages. To realize these features, a magnetoresistive random access memory (MRAM) device, a memory device storing data using a resistance change phenomenon at a magnetic tunnel junction (MTJ), has been introduced. An MRAM device may be operated at high speed and may have non-volatile characteristics. In addition, research is being conducted into spin transfer torque magnetoresistive random access memory (STT-MRAM) devices having improved recording densities.

SUMMARY

An exemplary embodiment of the present inventive concepts may provide a method of manufacturing a magnetic memory device having improved electromagnetic characteristics.

According to an exemplary embodiment of the present inventive concepts, a method of manufacturing a magnetic memory device may include forming a lower magnetic layer, a tunnel barrier layer, and an upper magnetic layer on a substrate. A magnetic tunnel junction pattern may be formed by etching a stacked structure including the lower magnetic layer, the tunnel barrier layer, and the upper magnetic layer. A boron-absorption layer may be formed covering the magnetic tunnel junction pattern, and a heat treatment process may be performed so that boron included in the upper and lower magnetic layers may be absorbed by the boron-absorption layer. The heat treatment may take place in a gaseous atmosphere including at least one of hydrogen, oxygen, and nitrogen.

In an exemplary embodiment of the present inventive concepts, the heat treatment process may be performed first in a gaseous atmosphere including hydrogen, and subsequently in a gaseous atmosphere including oxygen.

In another exemplary embodiment of the present inventive concepts, the heat treatment process may first be performed in a gaseous atmosphere including hydrogen, and subsequently in a gaseous atmosphere including oxygen and nitrogen.

In a further exemplary embodiment of the present inventive concepts, the heat treatment process may be performed in a heat-treatment chamber under the influence of a magnetic field. A direction of the magnetic field may be perpendicular to an upper surface of the substrate.

In an exemplary embodiment of the present inventive concepts, the heat treatment process may be performed at a temperature in a range of approximately between about 200° C. to about 400° C.

In an exemplary embodiment of the present inventive concepts, the heat treatment process may be performed at a pressure in a range of approximately between about 0.1 mTorr to about 760 mTorr.

In an exemplary embodiment of the present inventive concepts, the boron-absorption layer may include a metal having a higher degree of reactivity with boron than a material forming the upper and lower magnetic layers.

In an exemplary embodiment of the present inventive concepts, the boron-absorption layer may include at least one of hafnium (Hf), zirconium (Zr), titanium (Ti), tantalum (Ta), tungsten (W), and molybdenum (Mo).

In an exemplary embodiment of the present inventive concepts, the lower magnetic layer and the upper magnetic layer may be CoFeB layers, and the tunnel barrier layer may be an MgO layer.

In an exemplary embodiment of the present inventive concepts, a content of boron in the CoFeB layer may be within a range of approximately between about 20 mol % to about 30 mol %.

In an exemplary embodiment of the present inventive concepts, a thickness of the CoFeB layer may be within a range of approximately between about 10 Å to about 15 Å.

In an exemplary embodiment of the present inventive concepts, through the heat treatment process, boron in the upper and lower magnetic layers may be diffused out, and the upper and lower magnetic layers may be crystallized in a desired crystalline orientation.

In an exemplary embodiment of the present inventive concepts, through the heat treatment process, the boron-absorption layer may become a boron-absorption insulating layer having electrical insulation properties.

According to another aspect of the present inventive concepts, a method of manufacturing a magnetic memory device may include forming a stacked structure including a lower magnetic layer, a first tunnel barrier layer, an intermediate magnetic layer, a second tunnel barrier layer, and an upper magnetic layer. A magnetic tunnel junction pattern may be formed by etching the stacked structure. A boron-absorption layer may be formed covering the magnetic tunnel junction pattern. A heat treatment process may then be performed to crystallize at least a portion of the upper, intermediate, and lower magnetic layers. Boron included in the upper, intermediate, and lower magnetic layers may also be absorbed by the boron-absorption layer. The heat treatment process may first be performed in a gaseous atmosphere including hydrogen, and may subsequently be performed in a gaseous atmosphere including oxygen.

In an exemplary embodiment of the present inventive concepts, the heat treatment process may first be performed in a gaseous atmosphere including hydrogen, and may subsequently be performed in a gaseous atmosphere including both oxygen and nitrogen.

In an exemplary embodiment of the present inventive concepts, the heat treatment process may be performed in a heat-treatment chamber under the influence of a magnetic field having a direction that is perpendicular to the substrate.

In an exemplary embodiment of the present inventive concepts, the heat treatment process may be performed at a temperature in a range of approximately between about 200° C. to about 400° C.

In an exemplary embodiment of the present inventive concepts, the boron-absorption layer may include at least one of hafnium (Hf), zirconium (Zr), titanium (Ti), tantalum (Ta), tungsten (W), and molybdenum (Mo).

According to another aspect of the present inventive concepts, a method of manufacturing a magnetic memory device may include forming a stacked structure including a lower magnetic layer, a tunnel barrier layer, and an upper magnetic layer. A magnetic tunnel junction pattern may be formed by etching the stacked structure, and a boron-absorption insulating layer may be formed covering the magnetic tunnel junction pattern. Forming the boron-absorption insulating layer may include forming a boron-absorption layer covering the magnetic tunnel junction pattern and sequentially performing a heat treatment process. The heat treatment process may include performing a first heat treatment process in a gaseous atmosphere including hydrogen, and a second heat treatment process in a gaseous atmosphere including oxygen.

BRIEF DESCRIPTION OF DRAWINGS

The above and other aspects, features and advantages of the present inventive concepts will be more clearly understood from the following detailed description taken in conjunction with the accompanying drawings, in which.

DETAILED DESCRIPTION

Figure 1:
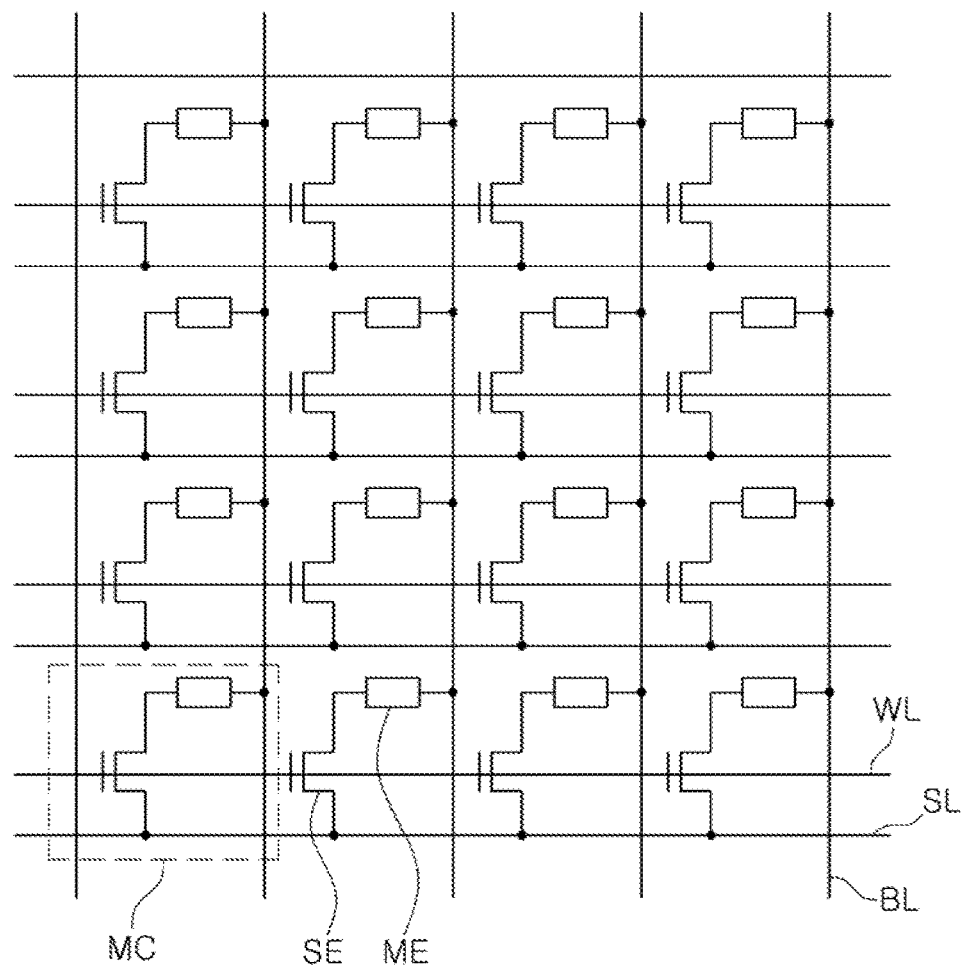
FIG. 1 is a circuit diagram illustrating a memory cell array of a magnetic memory device according to an exemplary embodiment of the present inventive concepts.

Exemplary embodiments of the present inventive concepts will now be described in detail with reference to the accompanying drawings.

The inventive concepts may, however, be exemplified in many different forms and should not be construed as being limited to the specific embodiments set forth herein. Rather, these embodiments are provided so that this disclosure will be thorough and complete, and will fully convey the scope of the inventive concepts to those skilled in the art. In the drawings, the shapes and dimensions of elements may be exaggerated for clarity, and the same reference numerals designate the same or like elements throughout.

Unless described otherwise, throughout this disclosure, directional terms such as "upper," "upper surface," "below," "lower surface," "upward," "downward," "lateral surface," "high," "low," and the like may be based on the orientation shown in the drawings, and may change in actual use depending on the direction in which a device is arranged. These terms should therefore be interpreted accordingly. Further, it will be understood that when a layer is referred to as being "on" or "under" another layer or a substrate, the layer may be formed directly on the other layer or the substrate, or one or more intervening layers may exist between them.

The terminology used herein is for the purpose of describing particular embodiments only and is not intended to be limiting of the present inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes each and all combinations including at least one of the referenced items.

It will be understood that, although the terms "first", "second", etc. are used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, a first element, component, region, layer, or section could be termed a second element, component, region, layer, or section without departing from the teachings of the present inventive concepts.

FIG. 1 is a circuit diagram illustrating a memory cell array of a semiconductor device according to exemplary embodiments of the present inventive concepts.

Referring to FIG. 1, a plurality of unit memory cells MC may be arranged two-dimensionally or three-dimensionally. The unit memory cells MC may be connected to a word line WL and a bit line BL intersecting each other. Each unit memory cell MC may include a magnetic memory element ME having a magnetoresistance element, and a selection element SE. The selection element SE and the magnetic memory element ME may be electrically connected in series. The magnetic memory element ME may be connected to an end portion of the selection element SE, and a source line SL may be connected to the selection element SE. The principles of the inventive concepts are not limited thereto, however.

The magnetic memory element ME may include a magnetic tunnel junction (MTJ). A resistance of the MTJ may vary depending on a magnetization direction of a free layer. For example, when the magnetization direction of the free layer is the same as a magnetization direction of a pinned layer, the MTJ may have a low resistance value. When the magnetization direction of the free layer is opposite to the magnetization direction of the pinned layer, however, the MTJ may have a high resistance value. In a semiconductor device, when the MTJ has the low resistance value, this may correspond to a data value '0', and when the MTJ has the high resistance value, this may correspond to a data value '1'.

In addition, the magnetic memory element ME may function as a memory, using a spin torque transfer (STT) phenomenon in which a magnetization direction of a magnetic material varies by currents input thereto. The selection element SE may be configured to selectively control a flow of charges passing through the MTJ. The selection element SE may, for example, be a diode, a bipolar transistor, and/or a field effect transistor.

Figure 2:
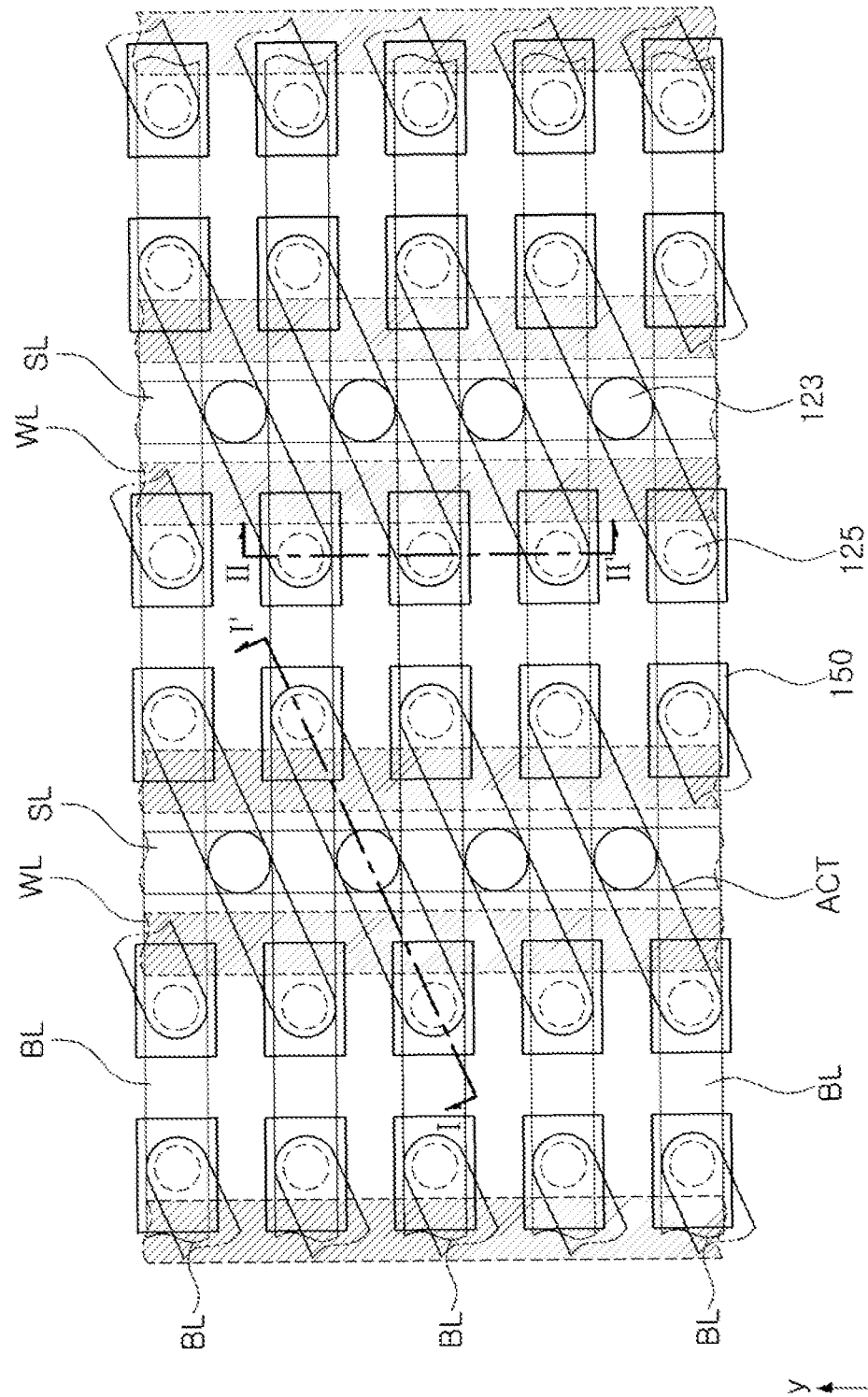
FIG. 2 is a plan view schematically illustrating a cell array of a magnetic memory device according to an exemplary embodiment of the present inventive concepts.

FIG. 2 is a plan view schematically illustrating a cell array of a magnetic memory device according to an exemplary embodiment of the present inventive concepts. More specifically, FIG. 2 is provided for describing an exemplary arrangement relationship and connection relationship of components, along with their sizes and shapes, in a semiconductor device 100.

Referring to FIG. 2, the semiconductor device 100 may include a plurality of active regions ACT, a plurality of word lines WL, a plurality of bit lines BL, a plurality of source lines SL, and a plurality of magnetic tunnel junction (MTJ) patterns 150.

The active regions ACT may be two-dimensionally arranged, and each of the active regions ACT may have a rectangular or bar shape forming predetermined angles with respect to an x-direction and a y-direction that are perpendicular to each other. The active regions ACT may extend in an oblique direction with respect to each of the x-direction and the y-direction. The active regions ACT may be arranged in rows along the x-direction and in columns along the y-direction.

The word lines WL may cross the active regions ACT and extend in the y-direction, for example. Two word lines WL may be arranged to cross one active region ACT. In this case, a pair of selection elements SE (see FIG. 1), for example, a pair of field effect transistors, may be disposed in the active region ACT. The source lines SL may be arranged to extend in a direction parallel to the word lines WL, that is, in the y-direction, and the bit lines BL may be arranged to extend in a direction perpendicular to the word lines WL, that is, in the x-direction.

In a single active region ACT, a source area of the selection element SE may be disposed between two word lines WL, and a drain area of the selection element SE may be formed in an outer side of each the two word lines WL. The source area and the drain area may be formed by doping substantially the same impurities. The source area and the drain area may be interchangeable depending on a circuit configuration.

First contact plugs 123 may be formed on the source areas. The first contact plugs 123 may electrically connect the source areas to the source lines SL.

Second contact plugs 125 may be formed on the drain areas. The second contact plugs 125 may be electrically connected to the MTJ patterns 150.

The MTJ patterns 150 may have a rectangular shape when viewed in a top view, but the inventive concepts are not limited thereto. In some embodiments, the MTJ patterns 150 may, for example, have a circular shape or a hexagonal shape in top view.

Figure 3:
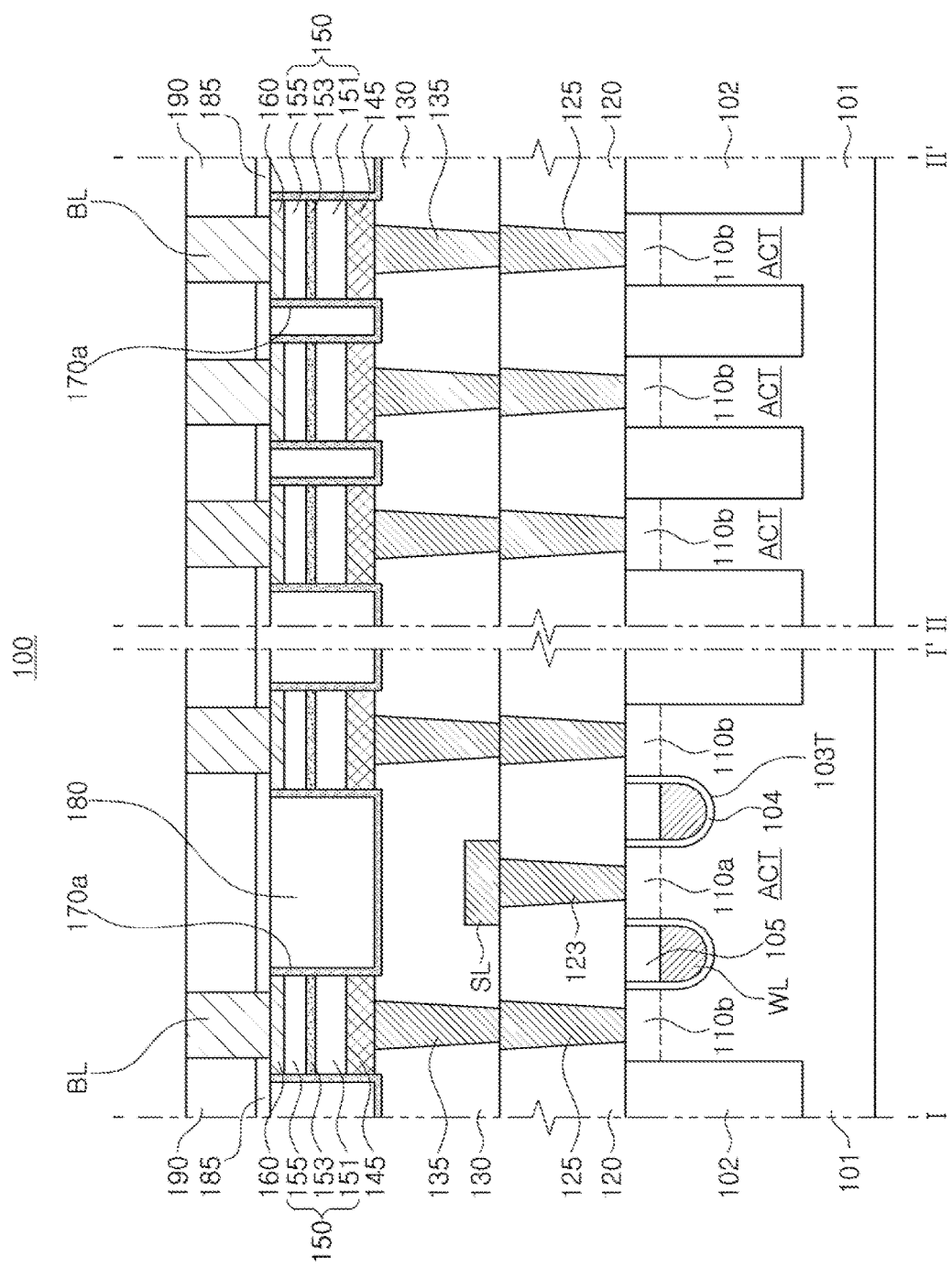
FIG. 3 is a schematic cross-sectional view of a magnetic memory device according to an exemplary embodiment of the present inventive concepts, taken along lines I-I' and II-II' of FIG. 2.

FIG. 3 is a schematic cross-sectional view of a magnetic memory device, taken along lines I-I' and II-II' of FIG. 2, according to an exemplary embodiment of the present inventive concepts.

Referring to FIG. 3, a magnetic memory device 100 may include a substrate 101, a device isolation layer 102 disposed in the substrate 101, an active region ACT defined in the substrate 101 by the device isolation layer 102, a word line WL buried in the substrate 101 in the active region ACT, a source line SL disposed on the substrate 101, and an MTJ pattern 150. In addition, the semiconductor device 100 may further include a first contact plug 123 connecting the source line SL to the active region ACT, a second contact plug 125 connecting the active region ACT to the MTJ pattern 150, a lower electrode layer 145 and capping electrode layer 160 disposed to contact the MTJ pattern 150, a third contact plug 135 connecting the lower electrode layer 145 to the second contact plug 125, and a bit line BL connected to the capping electrode layer 160. The MTJ pattern 150 may include a lower magnetic layer 151, a tunnel barrier layer 153, and an upper magnetic layer 155.

The substrate 101 may include a semiconductor material, such as a group IV semiconductor, a group III-V compound semiconductor, or a group II-VI oxide semiconductor. For example, the group IV semiconductor may include silicon, germanium, or silicon-germanium. The substrate 101 may be a bulk wafer, an epitaxial layer, a silicon-on-insulator (SOI) layer, a semiconductor-on-insulator (SeOI) layer, or the like.

The device isolation layer 102 may be formed of an insulating material. The device isolation layer 102 may be formed, for example, using a shallow trench isolation (STI) process. The device isolation layer 102 may, for example, be an oxide, a nitride, or a combination thereof.

The active region ACT may be defined by the device isolation layer 102, and first and second impurity areas 110a and 110b, respectively, may be formed therein. The first impurity area 110a may be a source area, and a second impurity area 110b may be a drain area. The first and second impurity areas 110a and 110b, respectively, may extend from an upper surface of active region ACT to a predetermined depth in the substrate 101. The first impurity area 110a may be disposed between a pair of word lines WL passing through a single active region ACT, and the second impurity area 110b may be disposed at outer sides of the word lines WL in the active region ACT. The first and second impurity areas 110a and 110b, respectively, may include different conductivity-type impurities from the active region ACT.

The pair of word lines WL may be buried in the substrate 101 and pass through the single active region ACT. The word line WL may be formed in a trench 103T, and may have an upper surface disposed at a level lower than a level of the upper surface of the active region ACT. The word line WL may include at least one of a semiconductor material doped with dopant (e.g., doped silicon), a metal (e.g., tungsten, aluminum, titanium, and/or tantalum), a conductive metal nitride (e.g., titanium nitride, tantalum nitride, and/or tungsten nitride), and a metal-semiconductor compound (e.g., a metal silicide).

The upper surface of the word line WL may be covered by a gate capping layer 105. The gate capping layer 105 may be formed of a silicon nitride layer, for example.

A gate insulating layer 104 may be disposed between the word line WL and the active region ACT. The gate insulating layer 104 may, for example, be formed of an oxide, a nitride, or an oxynitride. The gate insulating layer 104 may include, for example, a silicon oxide layer or an insulating layer having a high dielectric constant.

In this exemplary embodiment of the present inventive concepts, a buried channel array transistor (BCAT) including buried word lines WL is provided. However, the present inventive concepts are not limited thereto. In some embodiments, the selection element SE may be modified into another transistor, such as a planar transistor, a recess channel array transistor (RCAT), or a sphere-shaped recess channel array transistor (SRCAT), for example.

The first interlayer insulating layer 120 may be disposed on the entire substrate 101 to cover the gate capping layer 105. The first and second contact plugs 123 and 125, respectively, may be disposed to pass through the first interlayer insulating layer 120. The first contact plug 123 may be disposed on the first impurity area 110a to be connected to the source line SL. The second contact plug 125 may be disposed on the second impurity area 110b to be connected to the third contact plug 135.

The source line SL may be disposed on the first interlayer insulating layer 120 to extend parallel to the word line WL. The source line SL may be connected to the first contact plug 123.

A second interlayer insulating layer 130 may be disposed to cover the first and second contact plugs 123 and 125, respectively, and the first interlayer insulating layer 120. The third contact plug 135 may be disposed to pass through the second interlayer insulating layer 130. The third contact plug 135 may connect the lower electrode layer 145 below the MTJ pattern 150 to the second contact plug 125. Accordingly, the MTJ pattern 150 may be electrically connected to the second impurity area 110b.

The lower electrode layer 145 may be disposed on the third contact plug 135. The lower electrode layer 145 may include a conductive material, such as titanium (Ti), tantalum (Ta), ruthenium (Ru), titanium nitride (TiN), tantalum nitride (TaN), and/or tungsten (W). The materials may be used alone or in combination with one another. For example, lower electrode layer 145 may have a double layered structure, such as Ru/Ti, Ru/Ta, Ru/TiN, Ru/TaN, or TiN/W.

The MTJ patterns 150 may be disposed on the lower electrode layer 145. The MTJ patterns 150 may include the lower magnetic layer 151, the upper magnetic layer 155, and the tunnel barrier layer 153 interposed therebetween.

In this exemplary embodiment of the present inventive concepts, the lower magnetic layer 151 of the MTJ pattern 150 functions as a pinned layer and the upper magnetic layer 155 functions as a free layer. Alternatively, an MTJ pattern in which the lower magnetic layer 151 functions as a free layer and the upper magnetic layer 155 functions as a pinned layer may be formed. A magnetization direction of the pinned layer may be fixed, and a magnetization direction of the free layer may changeable to be the same as or opposite to the magnetization direction of the pinned layer.

In order to fix the magnetization direction of the pinned layer, that is, the lower magnetic layer 151, an anti-ferromagnetic layer (not shown) may be further disposed below the lower magnetic layer 151. The anti-ferromagnetic layer may include, for example, at least one of PtMn, IrMn, NiMn, FeMn, MnO, MnS, MnTe, and/or MnF.

The lower magnetic layer 151 may further include a ferromagnetic material. For example, lower magnetic layer 151 may include at least one of cobalt (Co), iron (Fe), and/or nickel (Ni), and may further include another element(s), such as boron (B), chrome (Cr), platinum (Pt), and/or palladium (Pd). The lower magnetic layer 151 may include at least one of CoFeB, CoFe, NiFe, CoFePt, CoFePd, CoFeCr, CoFeTb, CoFeGd, CoFeNi, CoFe, and/or NiFe. For example, the lower magnetic layer 151 may be formed of CoFe.

The lower magnetic layer 151 may have a synthetic anti-ferromagnetic (SAF) structure. The SAF structure may have a multilayer structure in which a plurality of magnetic layers and one or more connecting layers are sequentially stacked. For example, the SAF structure may have a multilayer structure in which a first ferromagnetic layer, a connecting layer, and a second ferromagnetic layer are sequentially stacked. For example, the first and second ferromagnetic layers may include at least one of CoFeB, CoFe, NiFe, CoFePt, CoFePd, CoFeCr, CoFeTb, CoFeGd, CoFeNi, CoFe, and/or NiFe. The bonding layer may include a non-magnetic material, and at least one of Ru, Ir, Rh, Cr, and/or Cu. The first ferromagnetic layer may have a magnetization direction fixed in one direction. The magnetization direction of the second ferromagnetic layer may be fixed in a direction opposite to that of the first ferromagnetic layer.

The tunnel barrier layer 153 may be disposed on the lower magnetic layer 151. The tunnel barrier layer 153 may include at least one material selected from the group consisting of MgO, $Al_2O_3$, $SiO_2$, and $B_2O_3$. The tunnel barrier layer 153 may be formed of MgO, for example. In this case, the tunnel barrier layer 153 may have a crystal structure oriented in a (001) plane of a body-centered cubic (BCC) structure.

The upper magnetic layer 155 may be disposed on the tunnel barrier layer 153. The upper magnetic layer 155 may include at least one of Co, Fe, and/or Ni, and may further include another element, such as B, C, Cr, Pt, and/or Pd. The upper magnetic layer 155 may include at least one of CoFeB, CoFe, NiFe, CoFePt, CoFePd, CoFeCr, CoFeTb, CoFeGd, CoFeNi, CoFe, and/or NiFe.

The capping electrode layer 160 may be disposed on the MTJ patterns 150. The capping electrode layer 160 may include a single layer or multiple layers of a conductive material, such as Ti, Ta, Ru, TiN, TaN, and/or W.

A boron-absorption insulating layer 170a may be formed to cover side surfaces of the MTJ patterns 150, lower electrode layers 145 and capping electrode layers 160, and an upper surface of the second interlayer insulating layer 130. The boron-absorption insulating layer 170a may be an insulating material including boron (B). The boron-absorption insulating layer 170a may be an oxide, a nitride, or an oxynitride including a metal element having a higher level of reactivity with boron (B) than materials forming the upper and lower magnetic layers 151 and 155, respectively. For example, the boron-absorption insulating layer 170a may be an oxide, a nitride, or an oxynitride including at least one of the Hf, Zr, Ti, Ta, W, and/or Mo. The boron-absorption insulating layer 170a may be formed by depositing a boron-absorption layer 170 (see FIG. 4C) including at least one metal element and performing a heat treatment process. Boron (B) included in the boron-absorption insulating layer 170a may be formed in such a manner that boron (B) included in the lower magnetic layer 151 and the upper magnetic layer 155 is absorbed and fixed in the boron-absorption insulating layer 170a through the heat treatment process.

An isolation insulating layer 180 covering the boron-absorption insulating layer 170a may be formed between the MTJ patterns 150. An etch-stop layer 185 and a third interlayer insulating layer 190 may be disposed on the isolation insulating layer 180. The bit line BL may be disposed on the capping electrode layer 160. An upper surface of the bit line BL may be substantially coplanar with the third interlayer insulating layer 190. The bit line BL may be formed of a metal having a low resistivity, such as Cu.

The interlayer insulating layers 120, 130, and 190, and the isolation insulating layer 180 may include at least one material selected from the group consisting of borophosphosilicate glass (BPSG), tonen silazene (TOSZ), undoped silicate glass (USG), spin-on glass (SOG), flowable oxide (FOX), tetraethylorthosilicate (TEOS), and a high density plasma chemical vapor deposition (HDP-CVD) oxide, for example.

FIGS. 4A to 4G are cross-sectional views schematically illustrating processes in a method of manufacturing a magnetic memory device according to an exemplary embodiment of the present inventive concepts. The cross-sectional views in FIGS. 4A to 4G are taken along line I-I' of FIG. 3.

Figure 4A:
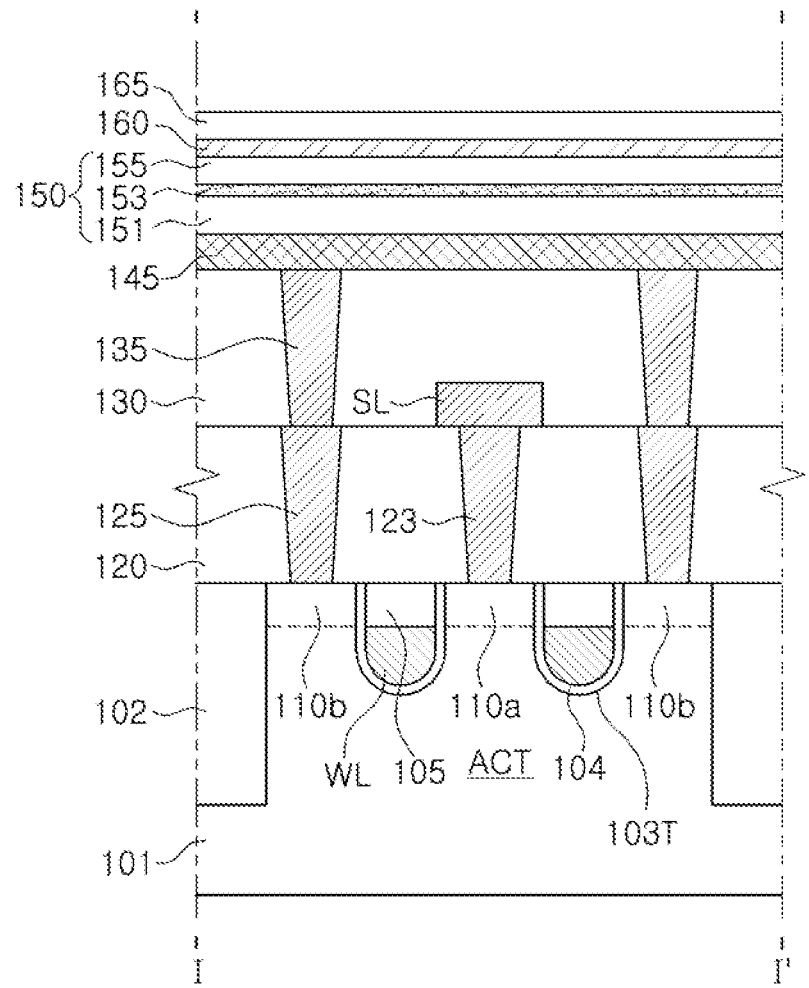
FIGS. 4A to 4G are cross-sectional views schematically illustrating certain processes of a method of manufacturing a magnetic memory device according to an exemplary embodiment of the present inventive concepts.

Referring to FIG. 4A, an active region ACT and a word line WL may be formed in the substrate 101.

First, a device isolation layer 102 may be formed in the substrate 101 to define the active region ACT. The active region ACT may include first and second impurity areas 110a and 110b, respectively, formed by implanting impurities in an upper portion thereof to a predetermined depth. The first and second impurity areas 110a and 110b, respectively, may be formed to be shallower than lower surfaces of the word lines WL. The first and second impurity areas 110a and 110b, respectively, may each function, for example, as a source area or a drain area of a transistor formed by the word line WL. When the word line WL configures an n-type metal-oxide-semiconductor (NNMOS) transistor, n-type impurity sources, such as $PH_3$ or $AsH_3$, for example, may be used in the ion-implantation process for forming the first and second impurity areas 110a and 110b, respectively. When the word line WL configures a p-type metal-oxide-semiconductor (PMOS) transistor, p-type impurity sources, such as $BF_3$ or $BCl_3$, for example, may be used in the ion-implantation process for forming the first and second impurity areas 110a and 110b, respectively.

Next, the word line WL may be formed in the active region ACT. A plurality of trenches 103T may be formed in the substrate 101, and then a gate insulating layer 104 and the word line WL (formed of a conductive material) may be sequentially formed in each trench 103T. A gate capping layer 105 may be formed on the word line WL filling the remaining space of the trench 103T.

Next, a first interlayer insulating layer 120 and first and second contact plugs 123 and 125, respectively, may be formed on the substrate 101 having the active region ACT and the word line WL formed therein.

The first interlayer insulating layer 120 may include silicon oxide. Alternatively, the first interlayer insulating layer 120 may include at least one material selected from the group consisting of BPSG, TOSZ, USG, SOG, FOX, TEOS, and an HDP-CVD oxide.

Portions of the first interlayer insulating layer 120 may be removed using an additional mask layer to form contact holes passing through the first interlayer insulating layer 120. Next, a conductive material may be formed on the first interlayer insulating layer 120, filling the contact holes, and the conductive material may be removed through a planarization process, such as a chemical mechanical polishing (CMP) process and/or an etch-back process, until the first interlayer insulating layer 120 is exposed. Thus, the first and second contact plugs 123 and 125, respectively, may be formed, each connected to a corresponding one of the first and second impurity areas 110a and 110b, respectively. The first and second contact plugs 123 and 125, respectively, may include, for example, at least one of doped Si, W, Al, Ti, Ta, TiN, TaN, WN, and/or a metal silicide.

Next, a source line SL may be formed by forming a conductive material layer on the first interlayer insulating layer 120 connected to the first contact plug 123 and by patterning the conductive material layer. The conductive material may include at least one of doped polysilicon, a metal silicide, a metal, and/or a metal nitride.

Next, a second interlayer insulating layer 130 may be formed on the first interlayer insulating layer 120 covering the source line SL. The second interlayer insulating layer 130 may include at least one material selected from the group consisting of BPSG, TOSZ, USG, SOG, FOX, TEOS, and an HDP-CVD oxide.

A contact hole may be formed exposing at least a portion of an upper surface of the second contact plug 125 by removing a portion of the second interlayer insulating layer 130. Next, a third contact plug 135 may be formed connected to the second contact plug 125 by depositing a conductive material in the contact holes and performing a planarization process. The third contact plug 135 may include at least one of, for example, doped Si, W, Al, Ti, Ta, TiN, TaN, WN, and/or a metal silicide.

Next, a lower electrode layer 145 may be formed covering the third contact plug 135 and the second interlayer insulating layer 130. The lower electrode layer 145 may include a conductive material, such as Ti, Ta, Ru, TiN, TaN, and/or W. For example, the lower electrode layer 145 may have a double layered structure of Ru/Ti, Ru/Ta, Ru/TiN, Ru/TaN, or TiN/W. The lower electrode layer 145 may, for example, be formed by an atomic layer deposition (ALD) process or a chemical vapor deposition (CVD) process.

A lower magnetic layer 151, a tunnel barrier layer 153, an upper magnetic layer 155, and a capping electrode layer 160 may be sequentially formed on the lower electrode layer 145. The lower magnetic layer 151, the tunnel barrier layer 153, the upper magnetic layer 155, and the capping electrode layer 160 may be formed, for example, by an ALD process or a CVD process. The lower magnetic layer 151 and the upper magnetic layer 155 may, for instance, include CoFeB, and a content of boron (B) may be in the range of approximately between about 20 mol % to about 30 mol %. A thickness of the CoFeB layer forming the lower magnetic layer 151 and the upper magnetic layer 155 may, for example, be in the range of approximately between about 10 Å to about 15 Å. The CoFeB layer may be formed in an amorphous phase in the deposition process. The tunnel barrier layer 153 may, for example, be MgO. The tunnel barrier layer 153 may be formed in a partially crystallized state in the deposition process. The capping electrode layer 160 may include a single layer or multiple layers of a conductive material, such as Ti, Ta, Ru, TiN, TaN, and/or W.

A mask layer 165 may be deposited on the capping electrode layer 160, and a mask pattern may be formed to correspond to a location of the third contact plug 135. The mask layer 165 may include silicon oxide, silicon nitride, and/or the like.

Figure 4B:
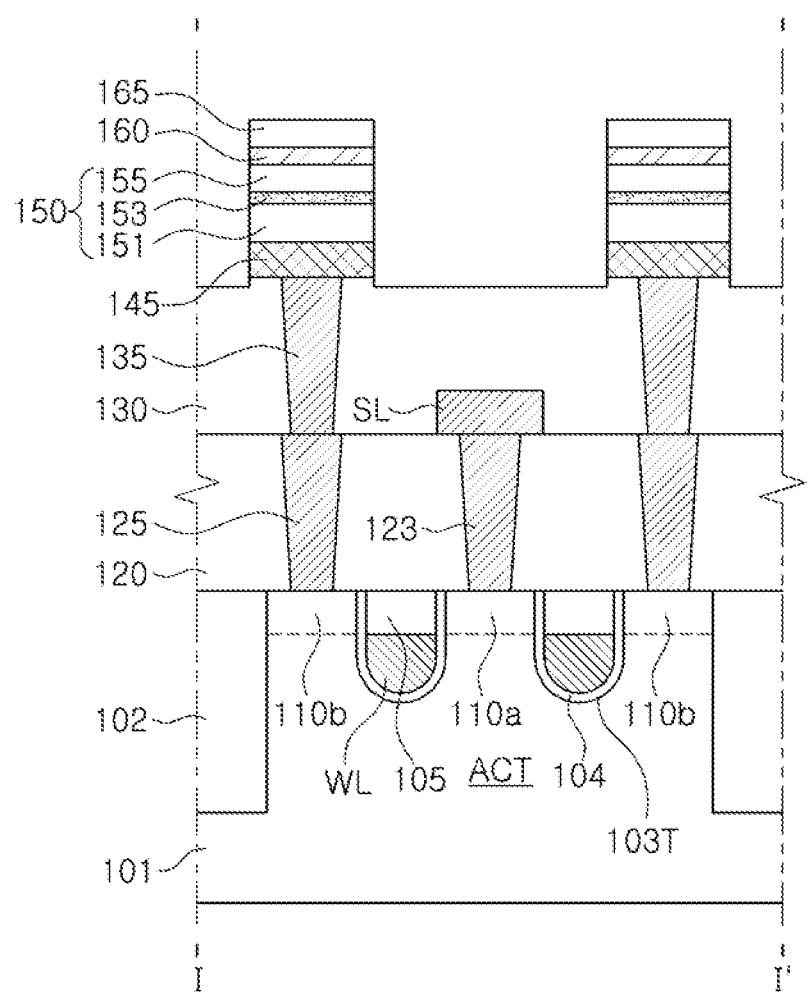

Referring to FIG. 4B, an MTJ pattern 150 may be formed by patterning a stacked structure including the lower electrode layer 145, the lower magnetic layer 151, the tunnel barrier layer 153, the upper magnetic layer 155, and the capping electrode layer 160 using the mask pattern as an etching mask.

The patterning may be performed, for example, using a dry etching process. More specifically, the patterning may be performed using an ion-beam etching process or a reactive-ion etching process. While performing the etching process, an upper surface of the second interlayer insulating layer 130 exposed between the MTJ patterns 150 may be recessed.

In FIG. 4B, an etching profile of the MTJ pattern 150 is illustrated as having a constant cross-sectional area from an upper portion to a lower portion thereof. However, in some embodiments, the MTJ pattern 150 may, for example, have an inclined etching profile whose cross-sectional area increases toward the lower portion thereof.

Figure 4C:
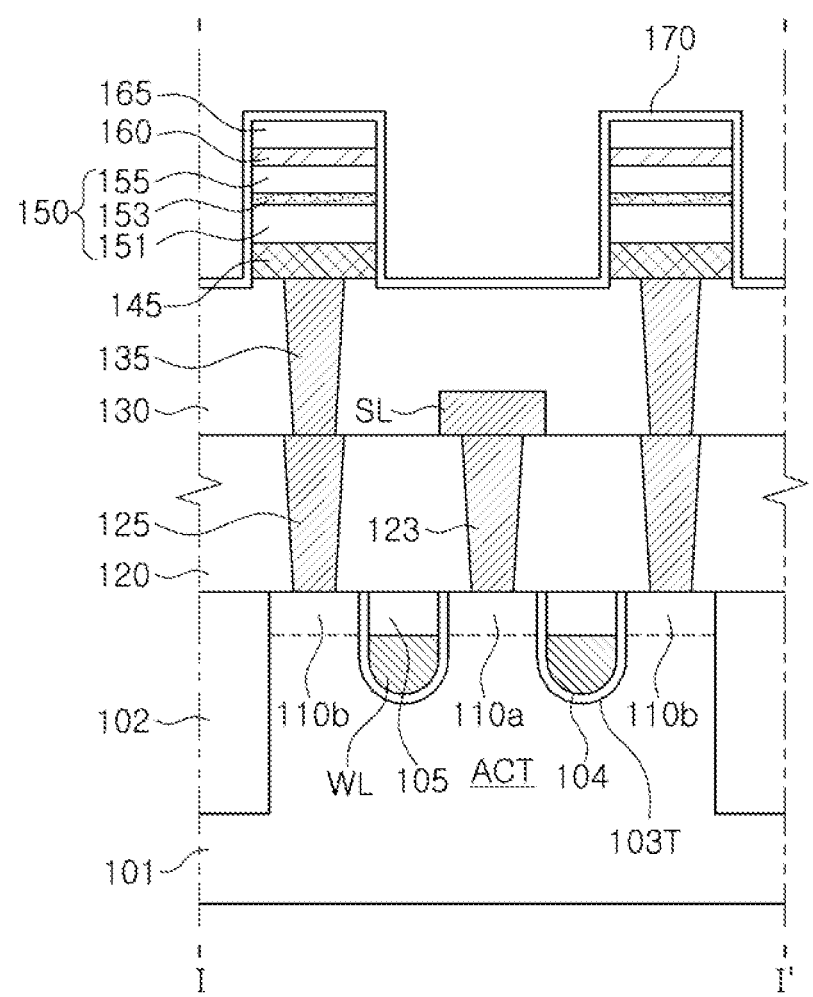

Referring to FIG. 4C, a boron-absorption layer 170 may be formed covering the MTJ pattern 150 and the second interlayer insulating layer 130. The boron-absorption layer 170 may include a metal element having a thermodynamically higher level of reactivity with boron (B) than the material configuring the lower magnetic layer 151 and the upper magnetic layer 155. That is, the boron-absorption layer 170 may be a material forming a boride more easily than the material configuring the lower magnetic layer 151 and the upper magnetic layer 155. For example, the boron-absorption layer 170 may include at least one of Hf, Zr, Ti, Ta, W, and/or Mo. The boron-absorption layer 170 may, for example, be formed using an ALD process or a CVD process.

Figure 4D:
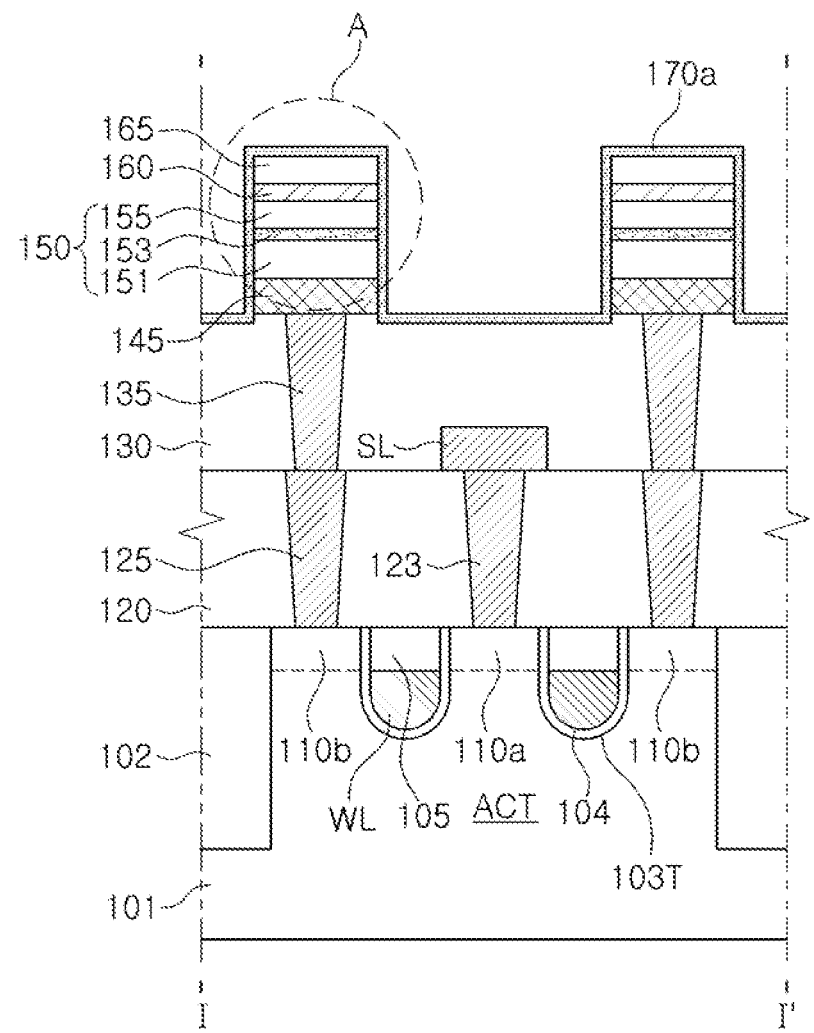

Referring to FIG. 4D, a boron-absorption insulating layer 170a may be formed by performing a heat treatment process on the substrate 101 covered by the boron-absorption layer 170. Through the heat treatment process, at least a portion of the upper and lower magnetic layers 151 and 155, respectively, may be crystallized and, simultaneously, boron (B) included in the upper and lower magnetic layers 151 and 155, respectively, may be rearranged such that it can be absorbed by the boron-absorption insulating layer 170a.

Figure 5:
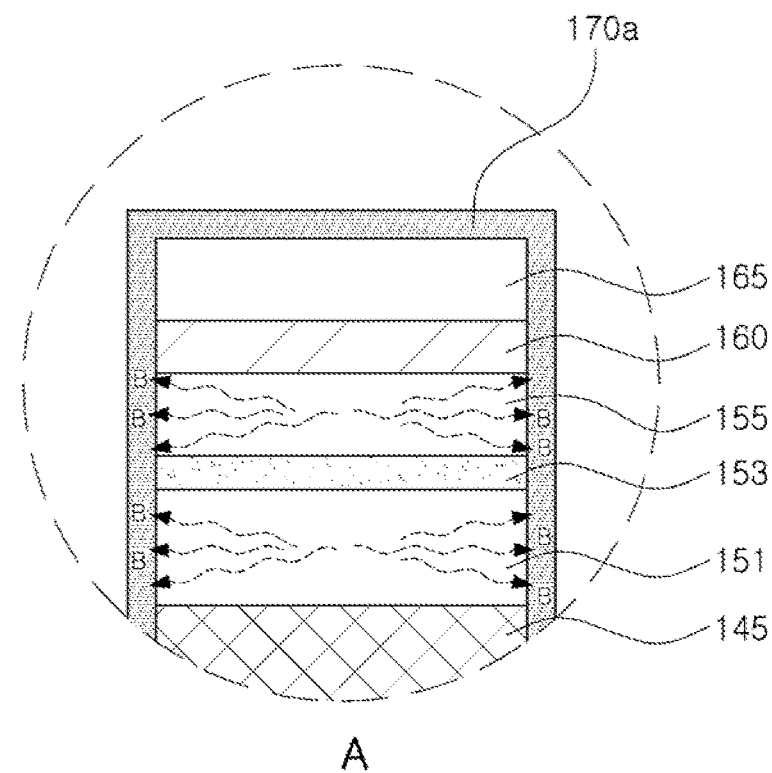
FIG. 5 is a cross-sectional view of an area "A" of FIG. 4D illustrating a boron-absorption insulating layer constructed according to an exemplary embodiment of the present inventive concepts.

As illustrated in FIG. 5, the heat treatment process may result in boron (B) included in the upper and lower magnetic layers 151 and 155, respectively, being rearranged and absorbed by the boron-absorption insulating layer 170a. As a result, boron (B) may not remain in the upper and lower magnetic layers 151 and 155, respectively. When the upper and lower magnetic layers 151 and 155, respectively, are formed of CoFeB layers, the CoFeB layers may be in an amorphous state before the heat treatment process is performed, but may gradually be changed into a crystalline state as the boron (B) is diffused into the boron-absorption layer 170 or the boron-absorption insulating layer 170a during the heat treatment process. After the heat treatment process is finished, the boron (B) may be fully diffused out of the lower and the upper magnetic layers 151 and 155, respectively, and these layers may have a cubic structure formed of CoFe.

In particular, when the tunnel barrier layer 153 is formed of MgO, and the CoFeB layers of the upper and lower magnetic layers 151 and 155, respectively, are in contact with the tunnel barrier layer 153 before the heat treatment process is performed, the CoFe layers of the upper and lower magnetic layers 151 and 155, respectively, may obtain a crystal structure oriented in a (001) plane of a cubic structure through the heat treatment process. This is because the tunnel barrier layer 153 that is partially crystallized in the deposition process may become a crystal structure oriented in a (001) plane of a BCC structure through the heat treatment process and, the crystallization of the upper and lower magnetic layers 151 and 155, respectively, which are in contact with the tunnel barrier layer 153, may be influenced by the crystalline orientation of the tunnel barrier layer 153.

Accordingly, by forming the boron-absorption layer 170 and performing the heat treatment process, boron (B) included in the upper and lower magnetic layers 151 and 155, respectively, may be substantially or completely removed from the MTJ pattern 150, and the crystal orientation of the upper and lower magnetic layers 151 and 155, respectively, contacting the tunnel barrier layer 153 may be consistent with the orientation of the tunnel barrier layer 153. In this manner, a resistance area (RA) of the MTJ pattern 150 may be reduced and a tunneling magnetoresistance (TMR) of the MTJ pattern 150 may be improved.

Figure 6:
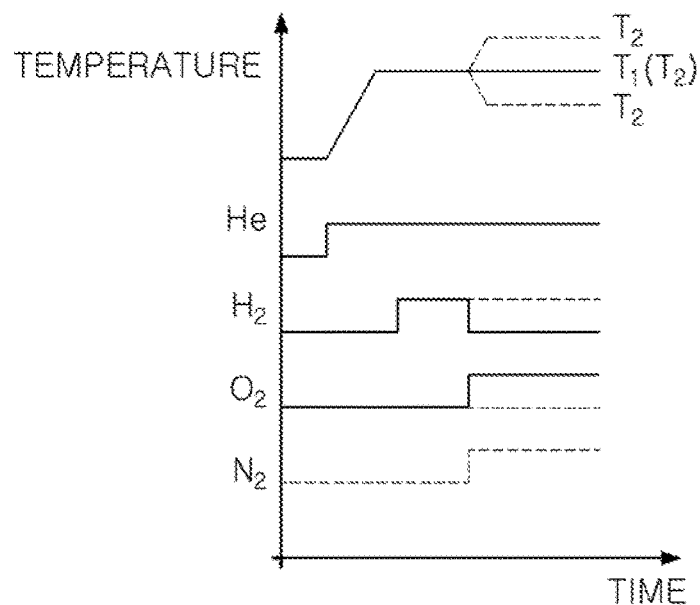
FIG. 6 is a graph illustrating application of temperature and gasses over time during a heat treatment process according to an exemplary embodiment of the present inventive concepts.

Referring now to FIG. 6, the heat treatment process will be described in more detail. FIG. 6 is a graph illustrating the application of heat and gasses over time during a heat treatment process according to an exemplary embodiment of the present inventive concepts.

More specifically, the heat treatment process may be performed at a pressure in the range of approximately between about 0.1 mTorr to about 760 mTorr and a temperature in the range of approximately between about 200° C. to about 400° C. The heat treatment process may be performed in a gaseous atmosphere including at least one of hydrogen, oxygen, and/or nitrogen. In order to control the pressure in the heat treatment process, a helium gas may also be injected. In some embodiments, the heat treatment process may first be performed in a gaseous atmosphere including hydrogen at a first temperature T1, and then in a gaseous atmosphere including oxygen at a second temperature T2 (which may be higher than, lower than, or the same as the first temperature T1). Performing the heat treatment in the gaseous atmosphere including hydrogen first may be advantageous because hydrogen has a relatively high level of reactivity with boron (B) may therefore assist in rearranging boron (B) to an outside of the MTJ pattern 150. The temperature of the heat treatment process performed in the gaseous atmosphere including oxygen may be higher than the temperature of the heat treatment process in the gaseous atmosphere including hydrogen, in order to facilitate the diffusion of oxygen into the boron-absorption layer 170 and to promote an oxidation reaction the boron-absorption layer 170.

In some embodiments, the heat treatment process may be performed first in a gaseous atmosphere including hydrogen and then in a gaseous atmosphere including both oxygen and nitrogen or just nitrogen. Hydrogen may be applied during the entire heat treatment process, or just during the first part of the process.

The reason for performing the heat treatment in the gaseous atmosphere including oxygen and/or nitrogen is to change the boron-absorption layer 170 into an insulating layer 170a through oxidization, nitridation, or oxynitridation. By converting the boron-absorption layer 170 into the insulating layer 170a, not only may electrical shorts between the lower magnetic layer 151 and the upper magnetic layer 155 be prevented, but electrical shorts between adjacent MTJ patterns 150 may also be prevented without requiring an additional etching process for removing the boron-absorption layer 170 formed on the second interlayer insulating layer 130 between the MTJ patterns 150.

The heat treatment process may be performed in a state in which a magnetic field is applied to a heat treatment chamber. By applying an appropriate magnetic field to the device during heat treatment, magnetization directions of the plurality of MTJ patterns 150 formed on the substrate 101 may be coincident with each other in a desired direction. For example, a direction of a magnetic field applied to the device in the heat treatment chamber may be perpendicular to an upper surface of the substrate 101. The magnetization directions of the plurality of MTJ patterns 150 having undergone the heat treatment process in the heat treatment chamber in which the magnetic field is applied may therefore be vertically aligned.

Figure 4E:
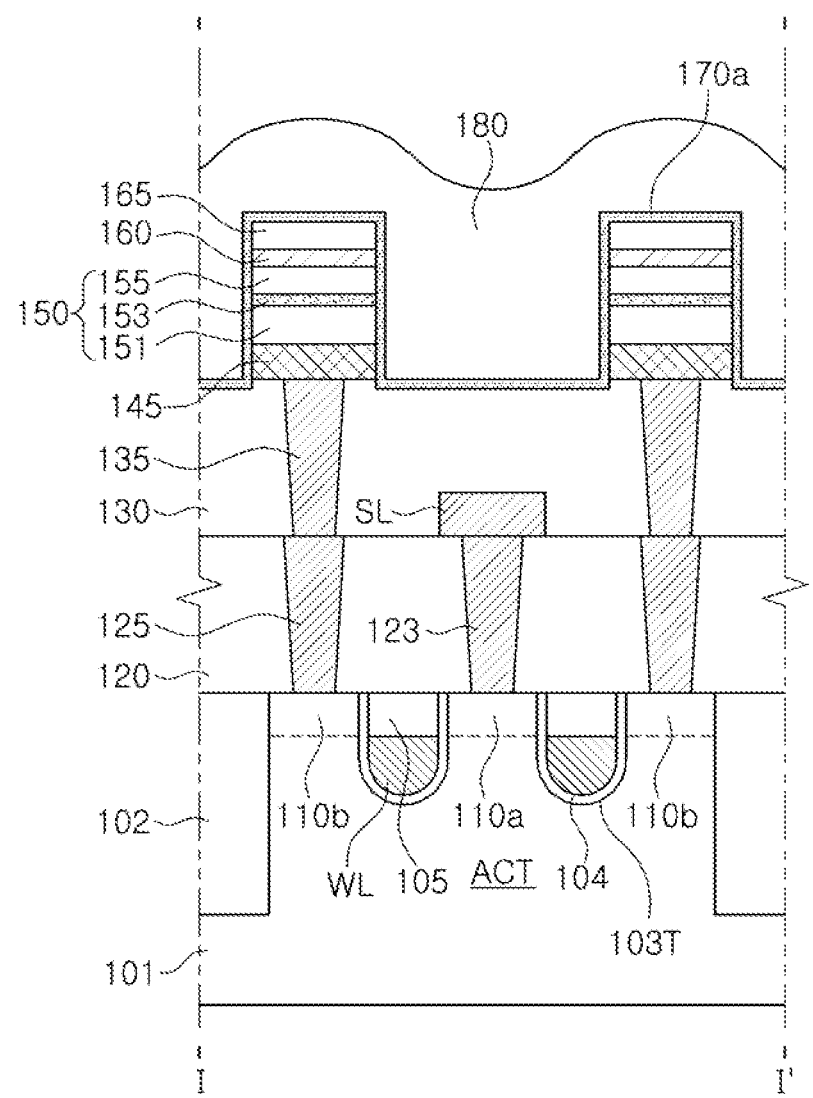

Referring to FIG. 4E, when the heat treatment process is finished, an isolation insulating layer 180 may be formed to fill a space between the MTJ patterns 150 having the boron-absorption insulating layer 170a disposed thereon. The isolation insulating layer 180 may include at least one material selected from the group consisting of BPSG, TOSZ, USG, SOG, FOX, TEOS, and HDP-CVD oxide.

Figure 4F:
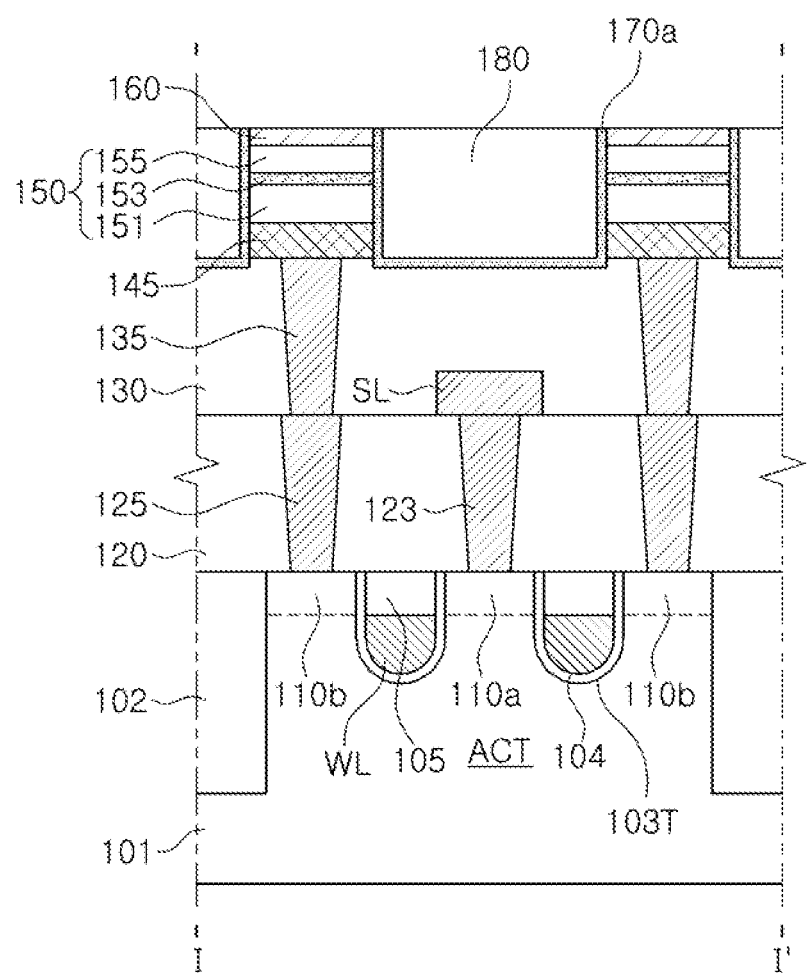

Referring to FIG. 4F, a planarization process may be performed to partially remove the isolation insulating layer 180 and expose an upper surface of the capping electrode layer 160. The planarization process may, for instance, include a CMP process or a dry etch-back process. When the planarization process includes the CMP process, the upper surface of the capping electrode layer 160 may be disposed substantially at the same level as an upper surface of the isolation insulating layer 180, as illustrated in FIG. 4F.

Figure 4G:
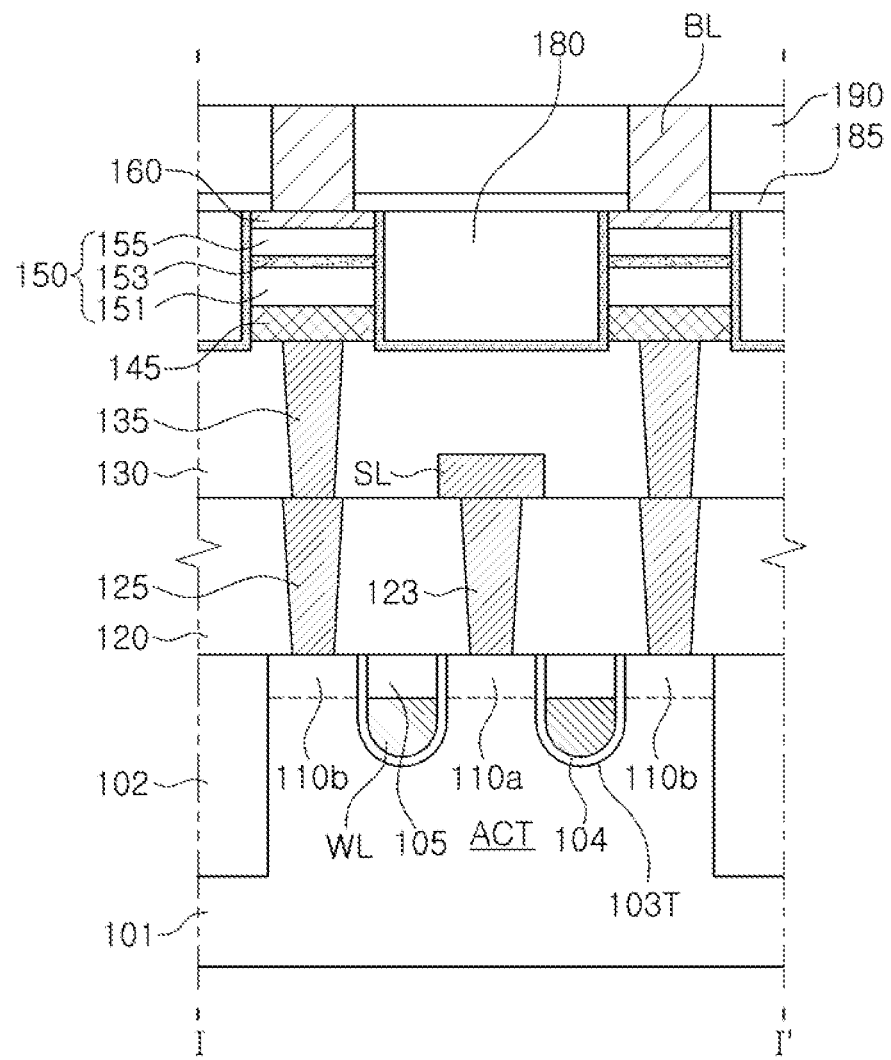

Referring to FIG. 4G, when the planarization process is finished, an etch-stop layer 185 and a third interlayer insulating layer 190 may be sequentially formed to fully cover the upper surfaces of the capping electrode layer 160 and the isolation insulating layer 180. Next, a line-type mask pattern (not shown) may be formed on the third interlayer insulating layer 190, and line-type openings may be formed by partly etching the third interlayer insulating layer 190 and the etch-stop layer 185 to expose the capping electrode layer 160. Next, a conductive material may fill the openings, and a bit line BL may be formed through a planarization process. An upper surface of the bit line BL may be substantially coplanar with an upper surface of the third interlayer insulating layer 190. The bit line BL may be formed of a metal having a low resistivity, such as Cu, for example.

Figure 7:
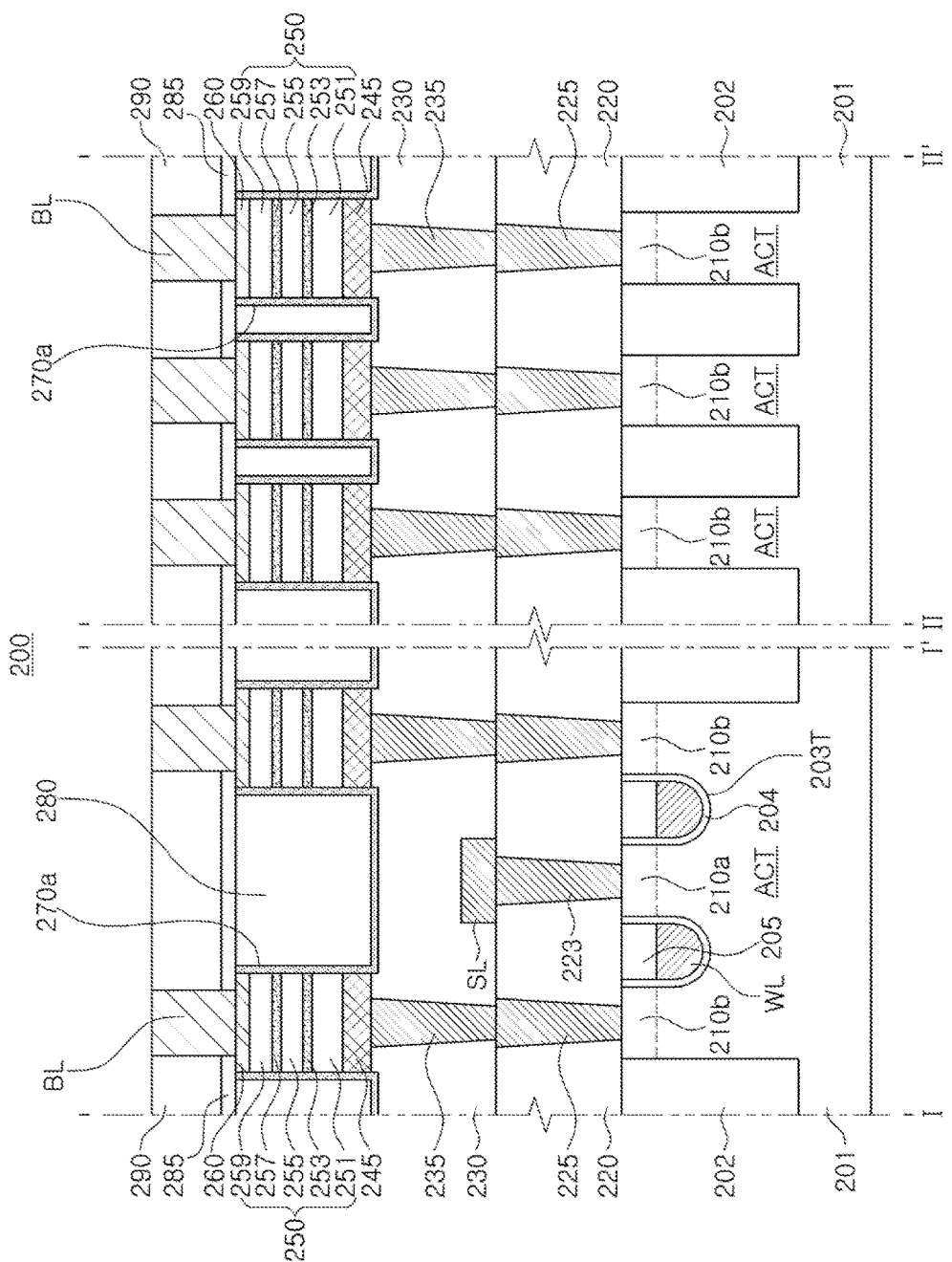
FIG. 7 is a schematic cross-sectional view of a magnetic memory device according to another exemplary embodiment of the present inventive concepts, taken along lines I-I' and II-II' of FIG. 2.

FIG. 7 illustrates a magnetic memory device 200 having a dual MTJ structure in which tunnel barrier layers 253, 257 are disposed at both sides of a free layer 255, differently from the magnetic memory device 100 illustrated in FIG. 3.

Referring to FIG. 7, the magnetic memory device 200 may include a substrate 201, a device isolation layer 202 disposed in the substrate 201, an active region ACT defined in the substrate 201 by the device isolation layer 202, a word line WL buried in the substrate 201, and a source line SL and a MTJ pattern 250 disposed on the substrate 201. In addition, the magnetic memory device 200 may further include a first contact plug 223 connecting the source line SL to the active region ACT, a second contact plug 225 connecting the active region ACT to the MTJ pattern 250, a lower electrode layer 245 and a capping electrode layer 260 in contact with the MTJ pattern 250, a third contact plug 235 connecting the lower electrode layer 245 to the second contact plug 225, and a bit line BL connected to the capping electrode layer 260. The MTJ pattern 250 may include a lower magnetic layer 251, a first tunnel barrier layer 253, an intermediate magnetic layer 255, a second tunnel barrier layer 257, and an upper magnetic layer 259.

The substrate 201 may include a semiconductor material, for example, a group IV semiconductor, a group III-V compound semiconductor, or a group II-VI oxide semiconductor. For example, the group IV semiconductor may include silicon, germanium, or silicon-germanium. The substrate 201 may be a bulk wafer, an epitaxial layer, an SOI layer, an SeOI layer, and/or the like.

The device isolation layer 202 may be formed of an insulating material. The device isolation layer 202 may, for example, be formed by an STI process. The device isolation layer 202 may, for example, be formed of an oxide, a nitride, or a combination thereof.

The active region ACT may be defined by the device isolation layer 202, and first and second impurity regions 210a and 210b, respectively, may be formed therein. The first impurity region 210a may be a source area, and the second impurity region 210b may be a drain area. The first and second impurity regions 210a and 210b, respectively, may extend from an upper surface of the active region ACT to a predetermined depth in the substrate 201. The first impurity area 210a may be disposed between a pair of word lines WL passing through a single active region ACT, and the second impurity area 210b may be disposed at outer sides of the pair of word lines WL in the active region ACT. The first and second impurity areas 210a and 210b, respectively, may include different conductivity-type impurities from the active region ACT.

The pair of word lines WL may be buried in the substrate 201 and pass through the single active region ACT. Each word line WL may be formed in a trench 203T, and may have an upper surface disposed at a level lower than a level at which the upper surface of the active region ACT is disposed. The word line WL may be formed of the same material as the word line WL described previously with reference to FIG. 3.

An upper surface of the word line WL may be covered by a gate capping layer 205. The gate capping layer 205 may, for example, be formed of a silicon nitride layer.

A gate insulating layer 204 may be disposed between the word line WL and the active region ACT. The gate insulating layer 204 may be formed of an oxide, a nitride, or an oxynitride. The gate insulating layer 204 may, for example, include a silicon oxide layer, or an insulating layer having a high dielectric constant.

In an exemplary embodiment, a BCAT structure including buried word lines WL is described. However, embodiments of the present inventive concept are not limited thereto. In some embodiments, for example, the selection element SE may be another transistor, such as a planar transistor, an RCAT, or an SRCAT.

A first interlayer insulating layer 220 may be disposed on the entire substrate 201 to cover the gate capping layer 205. First and second contact plugs 223 and 225, respectively, may be disposed through the first interlayer insulating layer 220. The first contact plug 223 may be disposed on the first impurity region 210a to be connected to the source line SL. The second contact plug 225 may be disposed on the second impurity area 210b and may be connected to the third contact plug 235 arranged on the second contact plug 225.

The source line SL may be disposed on the first interlayer insulating layer 220 and may extend in a direction parallel to the word line WL. The source line SL may be connected to the first contact plug 223.

A second interlayer insulating layer 230 may be disposed to cover the first and second contact plugs 223 and 225, respectively, and the first interlayer insulating layer 220. A third contact plug 235 may be disposed to pass through the second interlayer insulating layer 230. The third contact plug 235 may connect the lower electrode layer 245 below the MTJ pattern 250 to the second contact plug 225, and thereby the MTJ pattern 250 may be electrically connected to the second impurity region 210b.

The lower electrode layer 245 may be disposed on the third contact plug 235. The lower electrode layer 245 may include a conductive material, such as Ti, Ta, Ru, TiN, TaN, and/or W. The materials may be used alone or in combination with one another. For example, the lower electrode layer 245 may have a double layered structure of Ru/Ti, Ru/Ta, Ru/TiN, Ru/TaN, TiN/W, or the like.

The MTJ pattern 250 may be disposed on the lower electrode layer 245. The MTJ pattern 250 may include the lower magnetic layer 251, the first tunnel barrier layer 253, the intermediate magnetic layer 255, the second tunnel barrier layer 257, and the upper magnetic layer 259.

In an exemplary embodiment, the upper and lower magnetic layers 251 and 259, respectively, function as pinned layers, and the intermediate magnetic layer 255 functions as a free layer. A magnetization direction of the pinned layer may be fixed, and a magnetization direction of the free layer may be changeable to be the same as or opposite to the magnetization direction of the pinned layer.

In a dual MTJ structure, when the magnetization direction of the lower magnetic layer 251 and the magnetization direction of the upper magnetic layer 259 are fixed opposite to each other, a magnetic force of the lower magnetic layer 251 may be substantially offset by magnetic force of the upper magnetic layer 259. Accordingly, a write operation in the magnetic memory device having the dual MTJ structure may consume less current than a write operation in the magnetic memory device having a single MTJ structure. In addition, since the dual MTJ structure has an additional tunnel barrier layer, the dual MTJ structure may also provide a clearer data value during a read operation.

In order to fix the magnetization direction of the upper magnetic layer 259, that is, the pinned layer, an anti-ferromagnetic layer (not shown) may be further included on the upper magnetic layer 259. Similarly, in order to fix the magnetization direction of the lower magnetic layer 251, an anti-ferromagnetic layer (not shown) may further be included below the lower magnetic layer 251. The anti-ferromagnetic layers may include, for example, at least one of PtMn, IrMn, NiMn, FeMn, MnO, MnS, MnTe, MnF, and/or the like.

The lower, intermediate, and upper magnetic layers 251, 255, and 259, respectively, may each include a ferromagnetic material. For example, the lower, intermediate, and upper magnetic layers 251, 255, and 259, respectively may each include at least one of Co, Fe, and/or Ni, and may further include one or more other elements, such as B, Cr, Pt, and/or Pd. The lower, intermediate, and upper magnetic layers 251, 255, and 259, respectively, may each, for example, include at least one of CoFeB, CoFe, NiFe, CoFePt, CoFePd, CoFeCr, CoFeTb, CoFeGd, CoFeNi, CoFe, and/or NiFe. For example, the lower, intermediate, and upper magnetic layers 251, 255, and 259, respectively, may be formed of CoFe. The lower, intermediate, and upper magnetic layers 251, 255, and 259, respectively, may have a crystal structure oriented on a (001) plane of a cubic structure.

The lower magnetic layer 251 may have an SAF structure. The SAF structure may have a multilayer structure in which a plurality of magnetic layers and one or more connecting layers are sequentially stacked. For example, the SAF structure may have a multilayer structure in which a first ferromagnetic layer, a connecting layer, and a second ferromagnetic layer are sequentially stacked. For example, the first and second ferromagnetic layers may include at least one of CoFeB, CoFe, NiFe, CoFePt, CoFePd, CoFeCr, CoFeTb, CoFeGd, CoFeNi, CoFe, and/or NiFe. The second ferromagnetic layer arranged in contact with the first tunnel barrier layer 253 may be CoFe. The bonding layer may include a non-magnetic material, and at least one of Ru, Ir, Rh, Cr, and/or Cu. The first ferromagnetic layer may have a magnetization direction fixed in one direction. The magnetization direction of the second ferromagnetic layer may be fixed in a direction opposite to that of the first ferromagnetic layer.

The first tunnel barrier layer 253 may be disposed on the lower magnetic layer 251, and the second tunnel barrier layer 257 may be disposed on the intermediate magnetic layer 255. The first and second tunnel barrier layers 253 and 257, respectively, may each include at least one material selected from the group consisting of MgO, $Al_2O_3$, $SiO_2$, and $B_2O_3$. The tunnel barrier layers 253 and 257 may be formed of MgO, for example. In this case, the first and second tunnel barrier layers 253 and 257, respectively, may each have a crystal structure oriented in a (001) plane of a BCC structure.

The capping electrode layer 260 may be disposed on the MTJ patterns 250. The capping electrode layer 260 may include a single layer or multiple layers of a conductive material, such as Ti, Ta, Ru, TiN, TaN, and/or W.

A boron-absorption insulating layer 270a may be formed to cover side surfaces of the MTJ patterns 250, lower electrode layers 245 and capping electrode layers 260, and an upper surface of the second interlayer insulating layer 230. The boron-absorption insulating layer 270a may, for example, be an insulating material including boron (B). The boron-absorption insulating layer 270a may be an oxide, a nitride, or an oxynitride, including a metal element having a higher level of reactivity with boron (B) than a material forming the lower, intermediate, and upper magnetic layers 251, 255, and 259, respectively. For example, the boron-absorption insulating layer 270a may be an oxide, a nitride, or an oxynitride including at least one of the Hf, Zr, Ti, Ta, W, and/or Mo. The boron-absorption insulating layer 270a may be formed by depositing a boron-absorption layer including at least one of the metal elements and performing a heat treatment process. Boron (B) included in the boron-absorption insulating layer 270a may be formed in such a manner that boron (B) included in the lower magnetic layer 251, the intermediate magnetic layer 255, and the upper magnetic layer 259 is absorbed and fixed in the boron-absorption insulating layer 270a through the heat treatment process.

An isolation insulating layer 280 may be formed covering the boron-absorption insulating layer 270a between the MTJ patterns 150. An etch-stop layer 285 and a third interlayer insulating layer 290 may be disposed on the isolation insulating layer 280. The bit line BL may be disposed on the capping electrode layer 260. An upper surface of the bit line BL may be substantially coplanar with the third interlayer insulating layer 290. The bit line BL may be formed of a metal having a low resistivity, such as Cu, for example.

The interlayer insulating layers 220, 230, and 290 and the isolation insulating layer 280 may, for example, include at least one material selected from the group consisting of BPSG, TOSZ, USG, SOG, FOX, TEOS, and HDP-CVD oxide.

A method similar to the method of manufacturing the magnetic memory device 100, described with reference to FIGS. 4A to 4G, may be used to manufacture the magnetic memory device 200 illustrated in FIG. 7.

Figure 8:
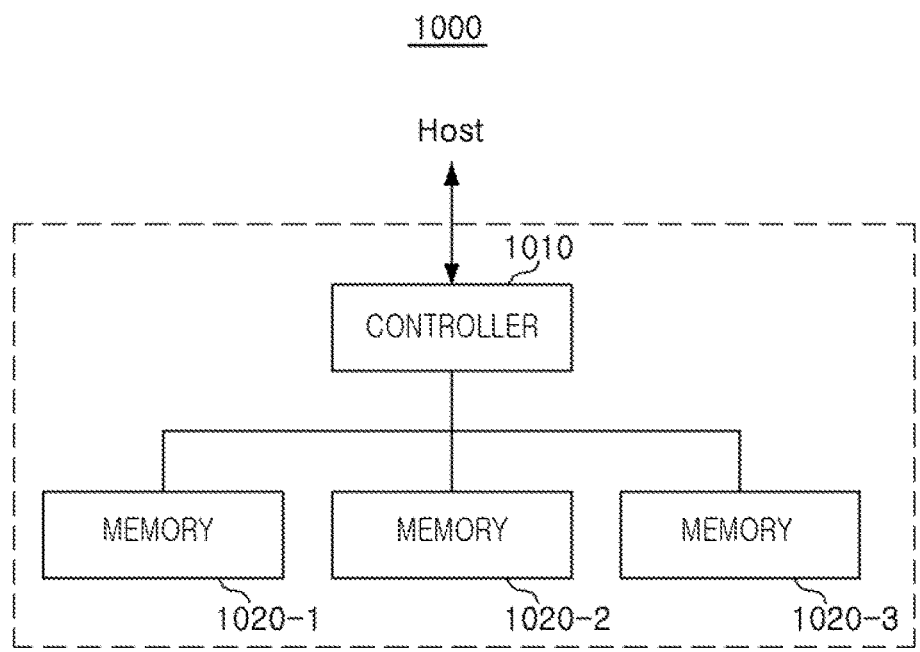
FIG. 8 is a block diagram illustrating a storage apparatus including a magnetic memory device constructed according to exemplary embodiments of the present inventive concepts.

FIG. 8 is a schematic block diagram illustrating a storage apparatus including a magnetic memory device constructed according to an exemplary embodiment of the present inventive concepts.

Referring to FIG. 8, a storage apparatus 1000 may include a controller 1010 communicating with a host HOST, and memories 1020-1, 1020-2, and 1020-3 storing data. Each of the memories 1020-1, 1020-2, and 1020-3 may include a magnetic memory device 100 or 200 (see FIG. 3 and FIG.

7) according to one or more of the various exemplary embodiments of the present inventive concepts, as described above.

The host HOST communicating with the controller 1010 may be any of a variety of electronic apparatuses in which the storage apparatus 1000 is installed, for example, a smartphone, a digital camera, a desktop PC, a laptop computer, a media player, or other electronic apparatus. The controller 1010 may receive a request for data read or write from the host HOST to generate a command CMD for writing data to the memories 1020-1, 1020-2, and 1020-3, or reading data from the memories 1020-1, 1020-2, and 1020-3.

As illustrated in FIG. 8, one or more memories 1020-1, 1020-2, and 1020-3 may be connected to the controller 1010 in parallel in the storage apparatus 1000. By connecting the plurality of memories 1020-1, 1020-2, and 1020-3 to the controller 1010 in parallel, the storage apparatus 1000 may have a large capacity, and may be capable of being used as a solid state drive (SSD).

Figure 9:
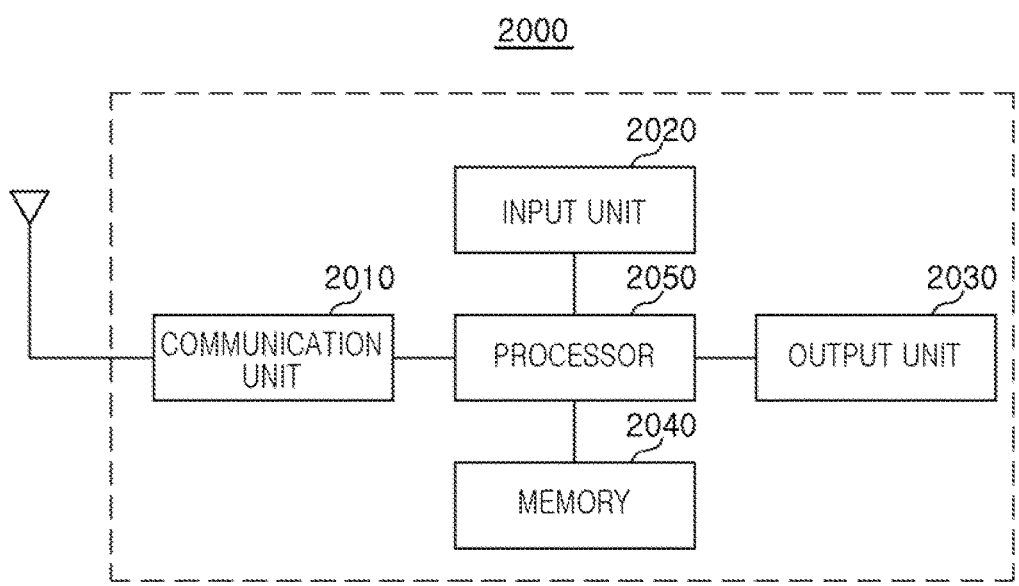
FIG. 9 is a block diagram illustrating an electronic apparatus including a magnetic memory device constructed according to exemplary embodiments of the present inventive concepts.

FIG. 9 is a schematic block diagram illustrating an electronic apparatus including a magnetic memory device constructed according to an exemplary embodiment of the present inventive concepts.

Referring to FIG. 9, an electronic apparatus 2000 may include a communication unit 2010, an input 2020, an output 2030, a memory 2040, and a processor 2050.

The communication unit 2010 may include a wired/wireless communications module, such as a wireless internet module, a short-range communications module, a GPS module, and/or a mobile communications module. The wired/wireless communications module included in the communication unit 2010 may be connected to an external communications network by a variety of communications standards to transmit and receive data.

The input 2020 may be a module supplied for a user to control an operation of the electronic apparatus 2000, and may include, for example, a mechanical switch, a touch screen, a voice recognition module, and/or the like. In addition, the input 2020 may include a track ball, a laser pointer mouse, and/or a touch interaction, and further include a variety of sensor modules in which a user can input data.

The output 2030 may output information processed by the electronic apparatus 2000 in an audio or video form. The memory 2040 may store a program for processing or controlling of the processor 2050, data, or the like. The memory 2040 may include one or more magnetic memory devices 100 or 200 (see FIG. 3 and FIG. 7) constructed according to any of the various exemplary embodiments of the present inventive concepts described above. The processor 2050 may write data or read data by transmitting a command to the memory 2040 according to a required operation.

The memory 2040 may be embedded in the electronic apparatus 2000 or may communicate with the processor 2050 through a separate interface. When the memory 2040 communicates with the processor 2050 through the separate interface, the processor 2050 may write data to or read data from the memory 2040 by a variety of interface standards, such as SD, SDHC, SDXC, MICRO SD, and/or USB.

The processor 2050 may control operations of each unit included in the electronic apparatus 2000. The processor 2050 may perform controlling or processing operations related to voice calls, video calls, or data communication, or controlling or processing operations for multimedia playback and management. In addition, the processor 2050 may process an input from a user transmitted through the input 2020, and output a result thereof through the output 2030. Further, the processor 2050 may write data required to control operations of the electronic apparatus 2000 to the memory 2040, or read the data from the memory 2040, as described above.

Figure 10:
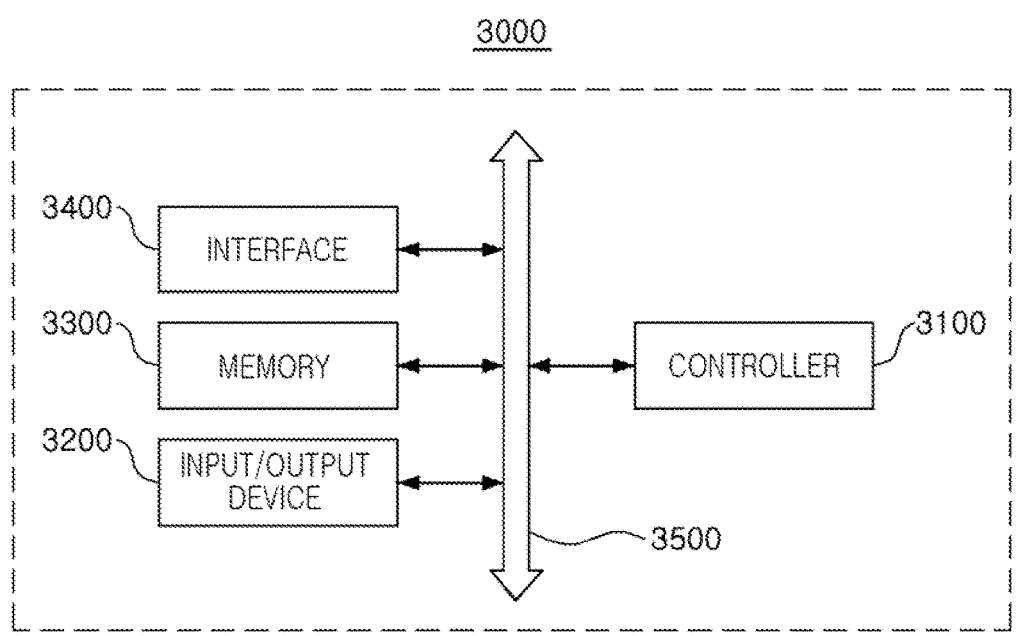
FIG. 10 is a schematic diagram illustrating a system including a magnetic memory device constructed according to exemplary embodiments of the present inventive concepts.

FIG. 10 is a schematic block diagram illustrating a system including a magnetic memory device constructed according to exemplary embodiments of the present inventive concepts.

Referring to FIG. 10, a system 3000 may include a controller 3100, an input/output 3200, a memory 3300, and an interface 3400. The system 3000 may, for example, be a mobile system or an information transmitting or receiving system. The mobile system may, for example, be a PDA, a portable computer, a web tablet, a wireless phone, a mobile phone, a digital music player, or a memory card.

The controller 3100 may function to execute a program or control the system 3000. The controller 3100 may, for example, be a microprocessor, a digital signal processor, a microcontroller, and/or the like.

The input/output 3200 may be used to input data to the system 3000 or output data from the system 3000. The system 3000 may be connected to an external apparatus, such as a PC or a network, through the input/output 3200 to exchange data with the external apparatus. The input/output 3200 may, for example, be a keypad, a keyboard, or a display.

The memory 3300 may store a code and/or data for operating the controller 3100, and/or data processed in the controller 3100.

The interface 3400 may be a data transmission path between the system 3000 and an external apparatus. The controller 3100, the input/output 3200, the memory 3300, and the interface 3400 may communicate through a bus 3500.

The controller 3100 or the memory 3300 may include one or more magnetic memory devices 100 and 200 (see FIG. 3 and FIG. 7) according to the various exemplary embodiments of the present inventive concepts described above.

As set forth above, according to exemplary embodiments of the present inventive concepts, a magnetic memory device having improved electromagnetic characteristics may be manufactured by forming a boron-absorption layer covering MTJ patterns and by performing a heat treatment process to remove boron from the MTJ patterns.

While exemplary embodiments have been shown and described above, it will be apparent to those skilled in the art that modifications and variations could be made thereto without departing from the spirit and scope of the inventive concepts as defined by the appended claims.

What is claimed is:
1. A method of manufacturing a magnetic memory device, said method comprising:
 forming a lower magnetic layer, a tunnel barrier layer, and an upper magnetic layer on a substrate, at least one of the lower magnetic layer and the upper magnetic layer comprises boron;
 forming a magnetic tunnel junction pattern by etching a stacked structure including the lower magnetic layer, the tunnel barrier layer, and the upper magnetic layer, the magnetic tunnel junction pattern including a side surface;
 forming a boron-absorption layer covering the side surface of the magnetic tunnel junction pattern; and performing a heat treatment process to cause boron included in the at least one of the upper and lower magnetic layers to be absorbed by the boron-absorption layer, wherein the heat treatment process is performed in a gaseous atmosphere including at least one of hydrogen, oxygen, and nitrogen, wherein the heat treatment process comprises a first heat treatment process performed in a gaseous atmosphere including hydrogen, and a second heat treatment process performed in a gaseous atmosphere including oxygen.

2. A method of manufacturing a magnetic memory device, said method comprising:

forming a lower magnetic layer, a tunnel barrier layer, and an upper magnetic layer on a substrate, at least one of the lower magnetic layer and the upper magnetic layer comprises boron;

forming a magnetic tunnel junction pattern by etching a stacked structure including the lower magnetic layer, the tunnel barrier layer, and the upper magnetic layer, the magnetic tunnel junction pattern including a side surface;

forming a boron-absorption layer covering the side surface of the magnetic tunnel junction pattern; and performing a heat treatment process to cause boron included in the at least one of the upper and lower magnetic layers to be absorbed by the boron-absorption layer, wherein the heat treatment process is performed in a gaseous atmosphere including at least one of hydrogen, oxygen, and nitrogen, wherein the heat treatment process comprises a first heat treatment process performed in a gaseous atmosphere including hydrogen, and undertaken second heat treatment process performed in a gaseous atmosphere including oxygen and nitrogen.

3. A method of manufacturing a magnetic memory device, the method comprising:

forming a stacked structure including a lower magnetic layer, a first tunnel barrier layer, an intermediate magnetic layer, a second tunnel barrier layer, and an upper magnetic layer, at least one of the lower magnetic layer, the intermediate magnetic layer and the upper magnetic layer comprises boron;

forming a magnetic tunnel junction pattern by etching the stacked structure, the magnetic tunnel junction pattern including a side surface;

forming a boron-absorption layer covering the side surface of the magnetic tunnel junction pattern; and performing a heat treatment process such that at least a portion of each of the upper, intermediate, and lower magnetic layers is crystallized and such that boron included in the at least one of the upper, intermediate, and lower magnetic layers is substantially absorbed by the boron-absorption layer, wherein the heat treatment process includes a first process performed in a gaseous atmosphere including hydrogen, and a second process performed in a gaseous atmosphere including oxygen.

4. The method of claim 3, wherein the heat treatment process is performed first in a gaseous atmosphere including hydrogen, and is subsequently be performed in a gaseous atmosphere including both oxygen and nitrogen.

5. The method of claim 3, wherein the heat treatment process is performed in a heat-treatment chamber under the influence of a magnetic field having a direction that is perpendicular to the substrate.

* * * * *